United States Patent [19]

Allman

[11] Patent Number: 5,527,872
[45] Date of Patent: Jun. 18, 1996

[54] ELECTRONIC DEVICE WITH A SPIN-ON GLASS DIELECTRIC LAYER

[75] Inventor: Derryl D. J. Allman, Colorado Springs, Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 214,477

[22] Filed: Mar. 17, 1994

Related U.S. Application Data

[63] Continuation-in-part of Ser. No. 582,570, Sep. 14, 1990, Pat. No. 5,302,198.

[51] Int. Cl.⁶ .................................................. C08G 77/08
[52] U.S. Cl. ............................. 528/12; 528/13; 528/14; 528/21; 528/33; 528/34; 528/38; 524/730; 525/477
[58] Field of Search ............................ 528/13, 14, 33, 528/34, 38, 21, 12; 524/730; 525/477

[56] References Cited

U.S. PATENT DOCUMENTS

| | | |
|---|---|---|
| 2,842,521 | 7/1958 | Nitzsche et al. ........................... 528/13 |
| 3,258,477 | 6/1966 | Plueddemann et al. . |
| 3,402,191 | 9/1968 | Morehouse . |
| 3,544,498 | 12/1970 | Holdstock et al. . |
| 3,615,943 | 10/1971 | Genser . |
| 3,789,023 | 1/1974 | Ritchie . |
| 3,832,202 | 8/1974 | Ritchie . |
| 3,837,873 | 9/1974 | Pollack et al. . |
| 3,892,608 | 7/1975 | Kuhn . |
| 3,905,823 | 9/1975 | Piskoti . |
| 3,915,766 | 10/1975 | Pollack et al. . |
| 3,928,225 | 12/1975 | Schäfer . |
| 3,969,168 | 7/1976 | Kuhn . |
| 3,975,294 | 8/1976 | Dumoulin . |
| 3,986,997 | 10/1976 | Clark . |
| 4,152,286 | 5/1979 | Crosson et al. . |
| 4,173,490 | 11/1979 | Rotenberg et al. . |
| 4,338,375 | 7/1982 | Hashimoto et al. . |
| 4,439,239 | 3/1984 | Greigger et al. . |
| 4,447,498 | 5/1984 | Fink et al. . |
| 4,493,886 | 1/1985 | Lauks . |
| 4,509,981 | 4/1985 | Sanders, Jr. et al. . |
| 4,557,797 | 12/1985 | Fuller et al. . |
| 4,563,241 | 1/1986 | Tanaka et al. . |
| 4,571,366 | 2/1986 | Thomas et al. . |
| 4,587,138 | 5/1986 | Yau et al. . |
| 4,605,450 | 8/1986 | Thomas et al. . |
| 4,619,719 | 10/1986 | Thomas et al. . |
| 4,620,986 | 11/1986 | Yau et al. . |
| 4,621,042 | 11/1986 | Pampalone et al. . |
| 4,652,618 | 3/1987 | Sumida et al. . |
| 4,663,414 | 5/1987 | Estes et al. ............................. 528/30 |
| 4,798,629 | 1/1989 | Wood et al. . |
| 4,808,653 | 2/1989 | Haluska et al. . |
| 4,835,089 | 5/1989 | Iwayanagi et al. . |
| 4,842,901 | 6/1989 | Merrem et al. . |
| 4,847,120 | 7/1989 | Gent . |
| 4,865,649 | 9/1989 | Kashiwagi et al. . |
| 4,885,262 | 12/1989 | Ting et al. . |
| 4,898,907 | 2/1990 | Haluska et al. . |
| 4,935,095 | 6/1990 | Lehrer . |
| 5,037,777 | 8/1991 | Mele et al. . |
| 5,100,503 | 3/1992 | Allman et al. . |
| 5,152,834 | 10/1992 | Allman . |
| 5,186,745 | 2/1993 | Maniar . |

FOREIGN PATENT DOCUMENTS

| | | |
|---|---|---|
| 0112168 | 6/1984 | European Pat. Off. . |
| 3014675 | 10/1981 | Germany . |
| 1097576 | 6/1984 | U.S.S.R. . |

OTHER PUBLICATIONS

Morimoto et al., "Manufacturable and Reliable Spin-on Glass Planarization ... Layer Technology", 5th Int'l. VLSI Multilevel Interconnect Conference Santa Clara, CA, Jun. 13–15, 1988, pp. 411–415.

*Primary Examiner*—Melvyn I. Marquis
*Attorney, Agent, or Firm*—Wayne P. Bailey

[57] ABSTRACT

There is provided electronic devices with dielectric layers obtained from boron-oxide doped, spin-on glass formulations which form glassy layers with high oxygen resistance. Suitable electronic devices include integrated circuits. With high oxygen resistance, the glassy layer formed maintains its integrity in subsequent processing. Also provided is a method for preparing boron-oxide doped, spin-on glass formulations with a high carbon content having a silane adhesion promoter and boron-dopant incorporated therein.

8 Claims, 1 Drawing Sheet

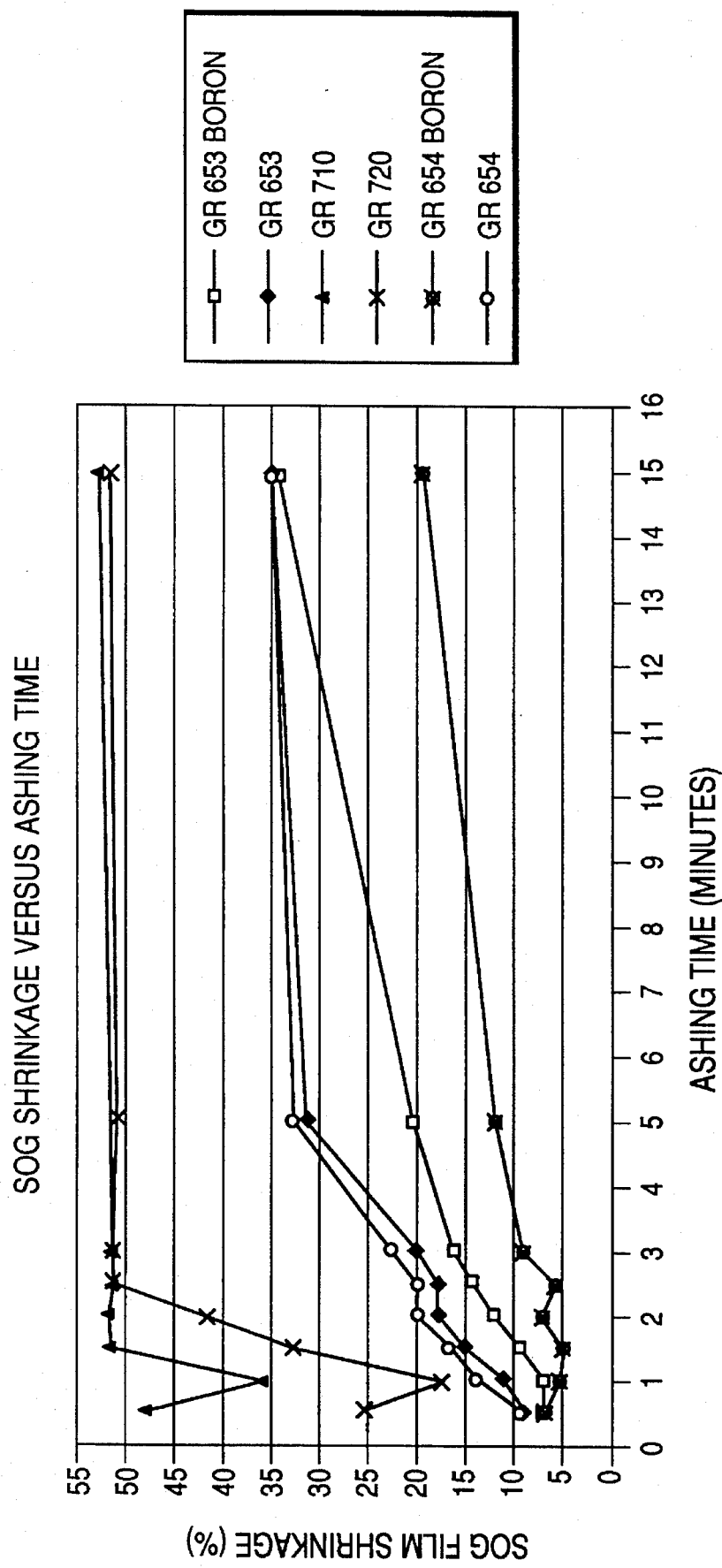

ELECTRONIC DEVICE WITH A SPIN-ON GLASS DIELECTRIC LAYER

CROSS-REFERENCE TO RELATED APPLICATION

This application is a continuation-in-part of U.S. application Ser. No. 07/582,570, filed Sep. 14, 1990, U.S. Pat. No. 5,302,198.

FIELD OF THE INVENTION

The present invention relates to electronic devices having a glassy dielectric layer derived from a coating solution commonly referred to as a "spin-on glass" formulation.

BACKGROUND OF THE INVENTION

A spin-on glass formulation is a liquid, silicon-based composition that can be applied to the surface of a substrate, such as a semiconductor wafer and spun with the wafer to provide a coating, preferably with a level top surface. With this technique, the spin-on glass formulation will preferably fill in any valleys or recessed areas in the surface of the semiconductor wafer that result from the various insulating and conductive regions. The spin-on glass coating is then dried to form a solid layer and subsequently cured at high temperatures to form a hard glassy layer. These silicon-based spin-on glass formulations often comprise polyorganosiloxane polymers, which resist shrinking and cracking when cured.

A number of materials are known to be suitable for use as spin-on glass formulations. For example, U.S. Pat. No. 3,615,943 (Genser), U.S. Pat. No. 3,832,202 (Ritchie), U.S. Pat. No. 4,798,862 (Wood et al.), U.S. Pat. No. 4,865,649 (Kashiwagi) and EP-A-112,649 each describe spin-on glass coating compositions based on polyorganosiloxanes.

Glassy layers obtained from such formulations (referred to herein also as "spin-on glass layers") have been used for various purposes in the manufacture of electronic devices. For example, they find use as planarizing layers, gettering layers for the removal of undesirable impurities, insulating layers for the isolation of multilayer metallizations, doping vehicles for semiconductive substrates for the incorporation of dopants in underlying semiconductor surfaces and absorption layers for enhancing contrast in photolithography techniques. In most of these applications the glassy layer is a utility layer which is applied temporarily to the semiconductor wafer or other substrates in the manufacture of the electronic devices. The spin-on glass layer is eventually removed from the final product, such as when it is used as a gettering layer, diffusion mask or doping vehicle as described in U.S. Pat. No. 4,619,719.

There are two general process schemes for using spin-on glass layers as planarization layers. One is an etch back process wherein after deposition, the spin-on glass layer is etched back to partially expose an underlying CVD oxide. The spin-on glass material remains in the voids providing a planarized surface. Another CVD oxide is then deposited over this planarized surface. The spin-on glass which remains only fills surface voids in this procedure and does not function as a continuous dielectric layer in the electronic device. The CVD oxide provides the continuous dielectric interlayer for the electronic device. In non-etchback processes, the spin-on glass layer is left in place as a continuous dielectric interlayer and helps serve to isolate multilayer metallizations. These continuous spin-on glass layers typically are encapsulated between two layers of CVD oxide to isolate the spin-on glass since it is vulnerable to attack (etching) in subsequent processing such as etching baths and oxygen plasma etch used to remove photoresists. Ting et al., U.S. Pat. No. 4,885,262, describes a method wherein the spin-on glass layer is encapsulated by an underlying CVD oxide and a modified surface obtained by treating the spin-on glass layer with siliating agents followed by oxygen annealing.

Despite the various formulations, a number of limitations exist with respect to the production and use of conventional spin-on glass compositions. Problems of surface damage from subsequent processing, poor adhesion (detachment) to the substrate and instability (shelf life less than six months) among others, have limited the utility of these compositions. For example, conventional spin-on glass layers provide planarization layers of less than 5,000Å for lower density (large dimension) semiconductor substrates. Another disadvantage of spin-on glass compositions has been that it is difficult to control the plasma etch rate of the layers produced in etch back processing since they are sensitive to oxygen concentration. A typical etching process uses a plasma such as a mixture of $CHF_3$ and $O_2$. When the underlying oxide is exposed, it releases additional oxygen into the plasma, causing a significant increase in the etch rate of the spin-on glass layer. This can result in the formation of recesses and loss of uniformity in the surface. These disadvantages have been addressed by Allman, the applicant herein, in providing spin-on glass compositions comprising crosslinked polyorganosiloxanes having a silane adhesion promoter incorporated therein and at least 30 atomic wt. % carbon. Such compositions are described herein, U.S. Pat. Nos. 5,100,503 and 5,152,834 and copending application Ser. No. 07/582,570, filed Sep. 14, 1990, U.S. Pat. No. 5,302,198. Despite the performance of these spin-on glass compositions in etch back applications, there is a continuing effort to further improve properties such as crack resistance and resistance to oxygen etching (ashing), particularly for non-etchback applications. When patterning vias into a dielectric layer, a high pressure oxygen plasma is typically used to remove the photoresist which patterns the vias. This oxygen attacks the carbon in the spin-on glass film forming carbon dioxide as a byproduct. A stand alone spin-on glass dielectric layer would be exposed to severe attack causing the film to shrink and crack. Where a spin-on glass dielectric layer is encapsulated with CVD oxide layers, it is still exposed to the oxygen plasma in the via cut. The spin-on glass exposed within the via cut shrinks and pulls away from the opening. This causes a problem in forming contacts through the via in that the sputtered metal is incapable of forming a continuous film from the top to the bottom of the via. The sensitivity of the spin-on glass layer to high pressure oxygen etch requires that non-traditional methods be used to remove the photoresist such as low pressure (less than 100 mTorr) oxygen ashing, wherein the oxygen radicals are more directional, preventing them from reacting with the exposed spin-on-glass layer.

It is desirable to provide a spin-on glass layer which is highly resistant to oxygen ashing. Such a glassy layer will allow precise via cuts when used as a dielectric interlayer for electronic devices, which is essential in high density/large scale integrated circuits.

OBJECTS OF THE INVENTION

It is, therefore, an object of the present invention to form spin-on glass layers with improved resistance to ashing by oxygen plasma.

It is another object of this invention to provide a method for producing a spin-on glass composition which will form glassy layers with improved resistance to oxygen ashing.

It is an additional object of the present invention to provide an electronic device, such as an integrated circuit, with an oxygen resistant dielectric interlayer derived from a spin-on glass formulation.

Upon further study of the specification and appended claims, further objects and advantages of this invention will become apparent to those skilled in the art.

SUMMARY OF THE INVENTION

The above objects are achieved by this invention through the use and manufacture of an organo-silicon based spin-on glass formulation which contains a boron-oxide dopant. This formulation provides spin-on glass layers with improved resistance to ashing by oxygen plasma which can function as a dielectric interlayer within an electronic device. The dielectric interlayer can be a "stand alone" dielectric layer or a dielectric interlayer encapsulated with two CVD oxide layers.

In selected embodiments, the spin-on glass layer is derived from a solution of crosslinked polyorganosiloxane polymers having 15 atom wt. % or more carbon. An organo functional silane adhesion promoter may optionally be incorporated therein. Polyorganosiloxanes based on dimethyldiethoxysilane monomers show superior resistance to oxygen ashing while maintaining a carbon content above 15 atomic wt. %. Formulations having methylphenyldiethoxy silane monomers and silane adhesion promoters such as aminoorganotri-$(C_1-C_4)$-alkoxy silanes, incorporated therein, also show improved $O_2$ ashing resistance.

The process for producing a boron-oxide doped, spin-on glass composition provided by this invention comprises dissolving a polyorganosiloxane polymer in an inert organic solvent, adding boric acid to the solution with reflux under an inert atmosphere, stabilizing the mixture and reacting the boron-polyorganosiloxane polymers within the mixture with a siloxane adhesion promoter under alkaline conditions and reducing the pH of the reaction means sufficiently to arrest a reaction between the boron-polyorganosiloxane and the silane adhesion promoter.

BRIEF DESCRIPTION OF THE DRAWINGS

Various other objects, features and attendant advantages of the present invention will be more fully appreciated as the same becomes better understood when considered in conjunction with the accompanying drawing, in which like reference characters designate the same or similar parts throughout the several views, and wherein:

FIG. 1 is a graph which shows the shrinkage of spin-on glass layers versus ashing time.

DESCRIPTION OF THE PREFERRED EMBODIMENT

The electronic devices of this invention include, but are not limited to, silicon-based devices, gallium arsenide devices, optical devices, opto-electronic devices, photovoltaic cells, MCM (multiple component modules) and any similar devices, which contain a dielectric layer. The density of the components in these electronic devices can vary significantly ranging from large scale integrated circuits such as VLSI or ULSI to printed circuit boards. The electronic devices of this invention have a dielectric layer, preferably an interlayer, comprised of a boron-oxide doped glassy layer, derived from a polyorganosiloxane spin-on glass formulation containing boron-oxide. The amount of boron-oxide within the spin-on glass formulation can vary widely and is preferably greater than 1 wt. % based on the total weight of the formulation. Most preferably, the spin-on glass formulation contains between 2 and 5 wt. % of the boron-oxide dopant, based on the total weight of the formulation; however, amounts as high as 30 wt. % of the boron-oxide dopant will provide suitable results.

The dielectric layer within the electronic devices of the present invention can vary widely in thickness from less than 0.1 microns to greater than 10 microns. The thickness of the dielectric layer is limited by its adhesion to the underlying substrate. Typical thicknesses range from about 0.2 to about 1 micron. These dielectric layers can be positioned between two layers including two conducting layers, two insulating layers, two semiconducting layers or a combination thereof. When positioned between two metal layers, the spin-on glass layer functions as a "stand alone" dielectric interlayer, i.e., no other dielectric layers separate the metal layers. Such a dielectric interlayer is relatively simple to form on the underlying metal layer; however, applying and patterning the subsequent metallization layer with a photoresist is more difficult with "stand alone" spin-on glass dielectric layers, particularly for high density/large scale integrated circuits, such as VLSI or ULSI circuits. These boron-oxide doped spin-on-glass layers can be capped with layers of silicon dioxide, oxynitride, nitride, a spin-on silanating layer or another spin-on-glass film (silicate or polysiloxane)In high density/large scale integrated circuits, it is preferable to cap or encapsulate the spin-on glass layer with oxide films to further protect against degradation from subsequent processing. For example, the dielectric interlayers can be encapsulated between plasma enhanced PE-CVD-ILD oxide layers having a thickness of from about 500Å–10,000 Å. An alternative to applying a capping layer is to form an $SiO_2$ layer from the boron-oxide doped spin-on-glass layer. This can be accomplished by a number of conventional techniques such as using a short RIE oxygen plasma treatment of the surface prior to the furnace anneal, anodizing the surface by an electrochemical reaction or silanation of the surface by applying another layer such as hexamethyldisiloxane to react with the spin-on-glass to strip away carbon and form a thin $SiO_2$ film. The latter method is performed in a furnace or RTP system.

As dielectric interlayers, the spin-on glass layers must often allow interconnections between layers requiring vias to be cut there through. Dielectric layers with thicknesses in excess of 1 micron can have vias cut there through by conventional photolithography processes, such as where a resist (photo emulsion) is spun on a substrate, baked (pre-exposure, typically <95° C.), exposed to a pattern, developed, baked again (post-exposure, typically <160° C.) and the wafer is etched (F, Br or Cl plasma) followed by removal of the resist. The dielectric interlayers provided by boron-oxide doped polyorganosiloxane spin-on glass formulations can provide suitable interconnects through vias deeper than 1 micron, with aspect ratios ranging from 0.01 to 15 (MCM to IC circuit). Preferably, the depth of the via, i.e., the thickness of the dielectric layer ranges from 0.4 micron to 1.1 microns. The $O_2$ etching resistance of the dielectric interlayer will allow for more uniform dimensions for the vias cut therein. Preferably, the dielectric interlayer within the electronic devices of the present invention will shrink less than 10% after cure of the spin-on glass formulation. Most preferably, the dielectric interlayer exhibits sufficient resistance to $O_2$ etch to limit shrinking to less than 10% with no cracks, following exposure to oxygen at 500 mTorr, 150° C.

The boron-oxide doped, spin-on glass formulation used to produce the dielectric interlayer is based on a polyorganosiloxane polymer. Spin-on glass formulations based on polyorganosiloxane polymers having a high organic content provide thick films without cracking during cure. However, the carbon present is susceptible to reaction with oxygen, forming carbon dioxide. The carbon content can vary widely and includes, but is not limited to, amounts within the range of 15–50 wt. %.

To achieve a carbon content of 15–50 wt. %, particularly 30 wt. % and above, the backbone of the crosslinked polyorganosiloxane is derived from a mixture of alkoxysilanes, some or all of which are substituted with organic radicals, such as $C_1$ to $C_4$ alkyl radicals and phenyl radicals. The carbon content is determined by the number of organo-substituted alkoxy silane monomers incorporated in the polymer chain. Glassy layers derived from a low carbon content spin-on glass formulation show better ashing resistance than those from spin-on glass formulations with higher carbon levels. As a consequence, the polymers based on methyl substituted monomers, i.e., dimethyldiethoxysilane monomers, which have a carbon content of about 25%, form films with better resistance to oxygen ashing than films from methyl-phenyl based polymers, which have a carbon content of about 50 wt. %.

The most common substituents are methyl and phenyl radicals. These substituents show high bonding energy to silicon and do not dissociate when the spin-on glass layer is exposed to high temperatures during cure. Other alkyl substituents such as ethyl, propyl and butyl radicals are acceptable where this dissociation can be avoided or ignored. Where high carbon content is desired in the spin-on glass formulation, the crosslinked polyorganosiloxane preferably has both methyl and phenyl radicals as substituents. The spin-on glass compositions having only phenyl substituents on the siloxane polymer provide layers which are difficult to etch with conventional equipment and may find use in selected non-etch back applications. The ratio of methyl to phenyl substituents preferably ranges from 1:1–3. For these embodiments, it is preferable for a portion of the silicon atoms in the crosslinked polyorganosiloxane to have both methyl and phenyl substituents bonded thereto. In other preferred embodiments, a portion of the silicon atoms have two methyl substituents bonded thereto. This can be accomplished where the crosslinked polyorganosiloxane is derived at least in part from dimethylalkoxysilanes, such as dimethylethoxysilane. These monomers provide greater flexibility in the final polyorganosiloxane polymer and the spin-on glass layers obtained from formulations with these polymers exhibit greater oxygen ashing resistance due to lower organic content.

The high organic content contributes to the low silanol content and the lower alkoxy content in the crosslinked polyorganosiloxanes used within the spin-on glass compositions. Preferably, the silanol content is less than 1.5 wt. % and the alkoxy content is less than 0.1 wt. %. The low values are also attributed to the crosslinks in the polymer.

The carbon content of the crosslinked polyorganosiloxanes can be determined using thermal gravametric analysis, wherein a weighed sample is decomposed as it is heated slowly in the thermal analyzer. The weight of the residue is then compared to the initial weight and the difference is considered the lost organic material. Alternatively, the film formed from the organopolysiloxane can be treated with an oxygen plasma for approximately 15 minutes and the weight loss is determined to be the carbon content.

The weight average molecular weight of the crosslinked polyorganosiloxane polymers used in the spin-on glass formulations to form the dielectric interlayer range from about 500 up to about 200,000. The only limits on the polymer molecular weight are that the polymer must be soluble in an inert organic solvent and that the solution formed must be sufficiently low in viscosity to allow uniform coating. The lower molecular weight polymers provide better planarity while the higher molecular weight polymers (20,000 and up) provide thicker films.

The spin-on glass formulations used to provide the dielectric interlayer in the electronic devices of the present invention have a boron-oxide dopant incorporated therein. Not wishing to be bound by theory, it is believed the boron-oxide dopant incorporates into the organopolysiloxane polymer to form a solution of a metallosiloxane dopant polymer. The boron-oxide content of the spin-on glass formulation can vary widely and is preferably greater than 1 wt. %, most preferably from 2 to 5 wt. %; however, much higher levels such as 30 wt. % boron oxide are effective. The boron-oxide dopant can be introduced into the formulation with a reactive boron compound such as a free acid of boric oxide. Preferred compounds contain both boron and oxygen. Trimethylborate and alkoxides or oxides of boric acid which are soluble in an inert organic solvent are also suitable. The reactive boron compound is preferably sufficiently reactive to be incorporated into the polymer by a reflux operation ranging from 1–12, typically 4 hours in duration. Boric acid is an example of such a reactive compound while trimethylborate has shown limited success with polymethylphenylsiloxane polymers. Alternative methods for providing a boron-oxide doped polymer can be used, including producing a siloxane polymer (resin) with boron-oxide molecules incorporated into the polymer framework. The molecular weight of such polymers are at the low end of the 500–200,000 range, and ar typically about 30,000 gm/mole.

In forming the dielectric interlayers for the electronic device of this invention, the crosslinked polyorganosiloxane is in solution, preferably at a concentration of about 5 to 20 wt. % solids, more preferably below 15 wt. % solids. Suitable solvents include monohydric and polyhydric alcohols, glycol ethers and glycol esters. The following are mentioned as examples of suitable monohydric alcohols: 1-butanol, 2-butanol, 2-methyl- 1-propanol, 2-methyl-2-propanol and 1-phenol. Suitable polyhydric oligomeric alcohols are ethylene glycol monoethylether, diethylene glycol monoethylether, triethylene glycol monoethylether, propylene glycol monoethylether, dipropylene glycol monoethylether, propylproposol and dipropylene glycol monomethylether. A suitable ester is propylene glycol monomethylether acetate. Mixtures of these alcohols and esters are also suitable. To facilitate drying, the inert organic solvent should have a boiling point below 250° C., preferably above 80° C. A preferred solvent is N-butanol. This solvent allows higher temperatures to be used in incorporating the boron-oxide dopant. These higher temperatures provide for more crosslinking, resulting in a denser spin-on glass layer.

The spin-on glass composition used to form the dielectric interlayer has a pH in the range of 3 to 7, preferably from 6 to 6.7. The acidic pH may be provided by an organic acid, hydrogen peroxide or by the boric acid used to provide the boron-oxide dopant. The viscosity of the spin-on glass composition preferably ranges from about 3.5 to 9 centistokes at the preferred solvent levels of 5 to 20 wt. %. If the viscosity is too low, multiple coats are necessary to attain the final spin-on glass layer. If the viscosity is too high, uniformity may be difficult to achieve when coating a substrate.

A particular class of spin-on glass formulations which can be used in the present invention are those which incorporate a silane adhesion promoter. These silanes are well known in the industry for improving the adhesion between organic resins and inorganic media, such as glass, sand or fillers. These silane adhesion promoters have two types of substituents, one is an organofunctional radical bonded directly to the silicon atom and the other is an organic substituent bonded through oxygen such as $C_1$–$C_4$ alkoxy or $C_2$–$C_4$ acetoxy. These alkoxy/acetoxy groups allow for incorporation of the silane into the crosslinked polyorganosiloxane. Preferably, the organofunctional silane has $C_1$–$C_4$ alkoxy groups and most preferably they are ethoxy or methoxy. The organofunctional groups are typically electrophilic. Commercially available silane adhesion promoters have aminoorgano, uridoorgano or glycydoxyorgano functional groups. Aminoorganotri($C_1$–$C_4$)alkoxy silanes are preferred, examples of which include gamma-aminopropyltriethoxysilane, gamma-aminopropyltrimethoxysilane, N-beta-(aminoethyl)-gamma-aminopropyltriethoxysilane and N-beta-(aminoethyl)-gamma-amino-propyltrimethoxysilane. The most preferred organofunctional silane adhesion promoter is gamma-aminopropyltriethoxysilane. The aminoorganotri($C_1$–$C_4$)alkoxysilanes are preferably incorporated at levels of 1 to 50 wt. % of the crosslinked polyorganosiloxane. Such levels provide a significant degree of crosslinking, allowing the polymer obtained to be characterized as a polyorganosilsesquioxane. Such polymers may have a structure consistent with the "cubic octamer" structure, double chain "ladder" structure or both. A. J. Barry et al. describe these structures in Chapter 5 of *Inorganic Polymers*, Ed. Stone & Graham, New York Academic Press (1962), page 195. These are complicated structures which result from the trifunctionality of the trialkoxysilanes having but one organic group on each silicon atom. Although tetraalkoxysilanes and diorganosiloxanes can be incorporated in these polymers, a significant portion of polymer is derived from trifunctional silanes.

The boron-oxide doped spin-on glass compositions utilized to form the dielectric interlayer within the electronic device of this invention is prepared by first dissolving a polyorganosiloxane within organic solvent. The solvent is preferably a mono or polyhydric alcohol or glycol ether having a boiling point of less than 250° C. and preferably greater than 80° C. Suitable species are as described above. N-butanol and propyl propasol are preferred. Polyorganosiloxanes with a high carbon content (greater than 15 wt. %) can be employed utilizing this protocol. The polyorganosiloxanes can be obtained by first cohydrolyzing a mixture of alkoxysilanes, some or all of which are substituted with organic radicals, preferably $C_1$–$C_4$ alkyl radicals. The polyorganosiloxanes can contain the desired level of methyl and phenyl substituents. These polyorganosiloxanes may be linear or they may have a significant number of crosslinks. They are limited in structure and molecular weight only to the extent that they must remain soluble within the inert organic solvent. Two or more polyorganosiloxanes may be used in varying proportions to provide spin-on glass formulations suitable for providing the requisite dielectric interlayer. However, such mixtures are not preferred.

The silanol content of these polyorganosiloxanes is low due to the high organic content and, sometimes, also due to crosslinking. Preferably, the silanol content is below 13 wt. % and the alkoxy content is less than 10 wt. %. The carbon content of polymethylphenylsiloxanes typically ranges from about 40 to 50 atomic wt. %. The carbon content of polymethylsiloxanes typically is from 15 to 40 atomic wt. %. The dissolved polyorganosiloxane is then refluxed with boric acid in a weight ratio between 1 to 15:100 boric acid to polymer, preferably about 12:100. The solution is preferably refluxed at least until the boric acid dissolves, typically about 1–12 hours, more typically about 4 hours for preferred levels of boron-oxide dopant. Long reflux times can be used to build up the molecular weight and provide thicker films. The solvent to polymer weight ratio preferably falls within the range of 1–2:1 solvent to polymer.

Optionally, the polyorganosiloxane-boron dopant solution may be reacted with a silane adhesion promoter, preferably an aminoorganotri-($C_1$ –$C_4$)-alkoxysilane, most preferably, gamma-aminopropyltriethoxysilane, under alkaline conditions. The aminoorganotri($C_1$–$C_4$)alkoxysilanes are sufficiently alkaline so as not to require addition of a base to the solution. Where the silane adhesion promoter is non-alkaline, it is expected a volatile organic amine may be introduced to promote reaction. The pH of the reaction medium is preferably 11 or above.

The amount of silane adhesion promoter reacted with the polyorganosiloxane can vary widely, but is preferably used in a weight ratio within the range 0.01 to 1.0: 1 of silane to polyorganosiloxane.

The pH of the reaction medium is reduced when it is desirable to slow down or arrest the reaction. The duration of the reaction will depend on the reaction rate, which is influenced by temperature. Allowing the reaction to proceed for 8 hours or more is preferred when conducted at ambient temperature. It is often desirable to terminate the reaction following the formation of a precipitate, as a precipitate is indicative of the formation of insoluble polymers, which must be removed from the spin-on glass composition. A reaction that proceeds for 2 hours or more at ambient temperature will be effective in producing spin-on glass compositions with silane adhesion promoter incorporated therein.

To substantially arrest the reaction, the pH should be reduced below 7, but not below 3.0, where acid catalyzed hydrolysis will proceed. The preferred pH range is 5 to below about 7, most preferably 6 to 6.7. This can be accomplished by the addition of an organic acid, such as acetic acid, or formic acid. The use of acetic acid is preferred. The amount of acid is typically 1.0 to 1.5 times the amount of adhesion promoter.

Once the reaction is stopped, it is preferable to age the composition before use, preferably about 1 week. It is also preferable to filter the solution with a submicron filter, such as a 0.2 micron Teflon filter, so as to remove any precipitate that forms during reaction.

The dielectric interlayers within the electronic devices of the present invention can be produced from the boron-oxide doped, spin-on glass formulations by conventional spin coat techniques wherein a substrate such as a semiconductor is spun at a rate in excess of 1,000 rpm to generate the uniform layer of the boron-oxide doped, spin-on glass formulation. The thickness of the layer can be modified by varying the viscosity of the spin-on glass formulation. The boron-oxide doped, spinon glass formulation is then dried by heating the wafer to about 200° C. Layers in excess of 5,000Å, can be obtained by multiple applications. After the coating is dried, the coated substrate is heated to a temperature of from about 350° to 500° C. to cure the dried spin-on glass and form a smooth uniform, boron-oxide doped, silicon-based layer. This layer will function as a dielectric interlayer.

The boron-oxide doped, spin-on glass formulation will exhibit low shrinkage once dried. Vertical shrinkage as high as 11% may be acceptable; however, it is preferable for shrinkage to be below about 10%. These boron-oxide doped, spin-on glass compositions can provide uniform oxide layers in excess of 5,000Å, without cracking or loss in subsequent processing, These layers are sufficiently resistant to oxygen ashing to allow their incorporation and use in an electronic device which is complete and operational.

The boron-oxide doped, spin-on glass formulations can be applied to semiconductor substrates, glass substrates, insulator (oxide) substrates and metal substrates by methods including the spin method, roller coater method, dipping and pull-up method, spray method, screen printing method, brushing method and the like.

Without further elaboration, it is believed that one skilled in the art can, using the preceding description, utilize the present invention to its fullest extent. The following preferred specific embodiments are, therefore, to be construed as fully illustrative and not limitative of the remainder of the disclosure in any way whatsoever.

From the foregoing and in the following examples, all temperatures are set forth in degrees Celsius, unless otherwise indicated, all parts and percentages are by weight. The entire disclosure of all applications, patents and publications recited above and below are hereby incorporated by reference.

EXAMPLES

The following experiments were done to determine the ashing rate of various spin-on glass materials. The following spin-on glass formulations were evaluated: GR653 (methylpolysiloxane), GR653 (boronoxide doped methylpolysiloxane), GR654 (methylpolysiloxane), GR654 (boron-oxide doped methylpolysiloxane), GR710 (methylphenylpolysiloxane) and GR720 (methylphenylpolysiloxane). The GR710 and GR720 formulations contain polyorganosiloxane polymers with a silane adhesion promoter incorporated therein. A silane adhesion promoter was not incorporated in the polymers of the GR653 and GR654 doped and undoped spin-on glass formulations. The rate at which the spin-on glass layer shrinks in a high pressure oxygen plasma is used as a measurement technique to define the ashing resistance of the spin-on glass material. The carbon content of the methyl-based polysiloxane polymers was lower than methylphenyl polysiloxane polymers. The boron was introduced to the methyl-based polysiloxane polymers by the refluxing procedure described below.

Boron-Oxide Doped, Spin-on Glass Formulation

The following process is suitable to incorporate the boron-oxide dopant into a polyorganosiloxane polymer. The polyorganosiloxane resin is mixed with either propylene glycol monomethylether (PM), propyleneglycolmonomethylether acetate (PMA) or propylpropasol (PP). The solution is then slurried. The optimum concentration of the flaked resin to solvent is 25 grams of resin to 50 grams of solvent. When a solid resin is used, the same proportions are to be used. When the resin used is liquid at 50% solids, then a 50:50 mix is used. To the resin-solvent solution, 3 grams of boric acid is dissolved. The solution is refluxed for 4 hours in a nitrogen ambient. The solution is then diluted with 25 grams of solvent to stabilize the mixture where the solution can be frozen until the next step. This is called the parent solution. Optionally, distilled A 1100 trimethoxyaminopropylsilane is added to the parent solution. The amount of A 1100 is equal to 1% of the total volume of the parent solution. The solution is stirred and the A 1100 is allowed to react for 1 to 4 hours. The reaction of the parent with the A 1100 causes the polysiloxane polymer to condense further and strip the OH groups off the base polysiloxane polymer. The A 1100 reaction can be quenched by adding either acetic acid or formic acid to the solution. The amount of acid is equal to 1 to 10 times the A1100 concentration. After the solution is quenched, solvent is added to the solution to reduce the resin solids content down to 50% or lower.

Not wishing to be bound by theory, it is believed that the oxygen radical in the plasma reacts with the boron to form a $B_2O_3$ oxide crust Or $B_2O_3$ crystals which fill the pores in the polymer network which inhibits further diffusion of the oxygen radicals or ozone into the spin-on glass layer. The preferred solvents are N-butanol or propyl propasol which allows the parent solution to be refluxed with the boric acid at a higher temperature providing a denser solid film.

Each spin-on glass formulation was applied to several bare silicon wafers consistent with the procedure below to form a spin-on glass layer.

Spin-on Glass Layer

A 1 gram solution is applied to a silicon wafer 4 inches in diameter. The wafer is rotated on a spinner for about 3 seconds at 1,000 rpm and then at 4,500 rpm for 30 seconds. The formulation coats the wafer uniformly without bubble formation or blistering. The wafer is then transferred to an elipsometer to determine the thickness and refractive index at points on the wafer. Following the measurement, the wafer is transferred to a hot plate and heated to about 200° C. for 1 minute to dry the coating. The coating thickness and refractive index are measured again with the elipsometer and percent vertical shrinkage is calculated. Once the desired thickness is obtained, the wafer is transferred to a tube furnace and heated to about 400° C. under nitrogen for 60 minutes. The centers of the wafer were then measured using an elipsometer to determine the index of refraction and the thickness of the wafer at 9 points, the average of these values is reported as the coating thickness and refractive index.

Following the furnace cure, the wafers were tested for oxygen ashing. One wafer from each spin-on glass formulation group was selected to be processed through one of eight oxygen ashing experimental splits. A tegal high pressure barrel asher was used for the ashing experiments. The tegal asher was set to 300 watts of power at a pressure of 500 mTorr and a barrel temperature of 150° C. The increase in the ashing time, starting at 30 seconds and stopping at 15 minutes, was the only change made in the process between each of the eight ashing experimental splits. The spin-on glass film thickness and index of refraction for each spin-on glass film were measured before and after each ashing experiment. Every spin-on glass layer was visually inspected for cracks after the ash. The results for each spin-on glass material are shown in Table 1.

TABLE 1

| SOG TYPE | ASHING TIME (MINS) | INITIAL THICKNESS (A) | FINAL THICKNESS (A) | SHRINKAGE (%) | INDEX OF REFRACT. | CRACKING YES or NO |
|---|---|---|---|---|---|---|
| GR 710 | 0.5 | 1294 | 670 | 48.22256569 | 1.42 | NO |
| GR 710 | 1 | 1262 | 806 | 36.13312203 | 1.49 | NO |
| GR 710 | 1.5 | 1258 | 609 | 51.58982512 | 1.47 | NO |
| GR 710 | 2 | 1262 | 609 | 51.74326466 | 1.47 | NO |
| GR 710 | 2.5 | 1270 | 618 | 51.33858268 | 1.46 | NO |
| GR 710 | 3 | 1270 | 617 | 51.41732283 | 1.46 | NO |
| GR 710 | 5 | 1271 | 616 | 51.53422502 | 1.46 | NO |
| GR 710 | 15 | 1275 | 598 | 53.09803922 | 1.47 | NO |
| GR 720 | 0.5 | 2837 | 2118 | 26.34367289 | 1.56 | NO |
| GR 720 | 1 | 2795 | 2292 | 17.99642218 | 1.48 | NO |
| GR 720 | 1.5 | 2870 | 1921 | 33.06620209 | 1.5 | NO |
| GR 720 | 2 | 2858 | 1668 | 41.63750875 | 1.5 | NO |
| GR 720 | 2.5 | 2838 | 1384 | 51.23326286 | 1.5 | NO |
| GR 720 | 3 | 2857 | 1382 | 51.62758138 | 1.5 | NO |
| GR 720 | 5 | 2804 | 1376 | 50.92724679 | 1.5 | NO |
| GR 720 | 15 | 2796 | 1339 | 52.11015737 | 1.5 | NO |
| GR 653 | 0.5 | 4933 | 4497 | 8.838435029 | 1.38 | YES |
| GR 653 | 1 | 4917 | 4357 | 11.38905837 | 1.38 | YES |
| GR 653 | 1.5 | 4890 | 4138 | 15.37832311 | 1.41 | YES |
| GR 653 | 2 | 4914 | 4013 | 18.33536834 | 1.37 | YES |
| GR 653 | 2.5 | 4903 | 4007 | 18.2745258 | 1.37 | YES |
| GR 653 | 3 | 4916 | 3906 | 20.54515867 | 1.36 | YES |
| GR 653 | 5 | 4856 | 3311 | 31.81630972 | 1.45 | YES |
| GR 653 | 15 | 4852 | 3153 | 35.01648805 | 1.45 | YES |
| GR 654 | 0.5 | 4967 | 4511 | 9.180591907 | 1.38 | YES |
| GR 654 | 1 | 4835 | 4153 | 14.10548087 | 1.41 | YES |
| GR 654 | 1.5 | 4828 | 4018 | 16.77713339 | 1.43 | YES |
| GR 654 | 2 | 4888 | 3919 | 19.82405892 | 1.39 | YES |
| GR 654 | 2.5 | 4866 | 3896 | 19.93423757 | 1.37 | YES |
| GR 654 | 3 | 4924 | 3771 | 23.41592201 | 1.4 | YES |
| GR 654 | 5 | 4830 | 3221 | 33.3126294 | 1.45 | YES |
| GR 654 | 15 | 4841 | 3156 | 34.80685809 | 1.44 | YES |
| GR 653 BORON | 0.5 | 5246 | 4880 | 6.976744186 | 1.4 | NO |
| GR 653 BORON | 1 | 5249 | 4867 | 7.277576681 | 1.4 | NO |
| GR 653 BORON | 1.5 | 5259 | 4749 | 9.697661152 | 1.39 | NO |
| GR 653 BORON | 2 | 5291 | 4628 | 12.53071253 | 1.38 | NO |
| GR 653 BORON | 2.5 | 5258 | 4483 | 14.73944466 | 1.4 | NO |
| GR 653 BORON | 3 | 5166 | 4306 | 16.64730933 | 1.42 | NO |
| GR 653 BORON | 5 | 5198 | 4097 | 21.18122355 | 1.37 | YES |
| GR 653 BORON | 15 | 5277 | 3476 | 34.1292401 | 1.44 | NO |
| GR 654 BORON | 0.5 | 10947 | 10197 | 6.851192107 | 1.39 | NO |
| GR 654 BORON | 1 | 10483 | 9911 | 5.456453305 | 1.4 | NO |
| GR 654 BORON | 1.5 | 10664 | 10118 | 5.120030008 | 1.39 | NO |
| GR 654 BORON | 2 | 10484 | 9710 | 7.382678367 | 1.4 | YES |
| GR 654 BORON | 2.5 | 10694 | 10045 | 6.068823639 | 1.39 | YES |
| GR 654 BORON | 3 | 10725 | 9698 | 9.575757576 | 1.39 | YES |
| GR 654 BORON | 5 | 10688 | 9326 | 12.74326347 | 1.39 | YES |
| GR 654 BORON | 15 | 10688 | 8606 | 19.47979042 | 1.4 | YES |

Discussion of Experimental Results

All of the spin-on glass layers from the GR653 and GR654 undoped, methylpolysiloxane, spin-on glass formulations exhibited cracks after each ashing experiment. The majority of the layers obtained from the GR653 boron-oxide doped, spin-on glass formulations did not crack except for the sample ashed for 5 minutes. Layers from the GR654 boron-oxide doped, spin-on glass formulation did not crack until the ashing time exceeded 2 minutes. These films may have cracked prematurely since the spin-on glass samples started out with a film thickness of roughly 1 micron, which may have caused the film to yield prematurely due to added film stress. The shrinkage that took place in layers that did not crack was only in the vertical direction. The cracked layers experienced shrinkage in both the vertical and horizontal directions. When all of the carbon has been removed from the spin-on glass layers, they no longer continue to shrink.

From FIG. 1 it is seen that all carbon is removed from the GR710 spin-on glass after 1.5 minutes of ashing. The carbon content of this formulation is approximately 50% (by TGA analysis) which is in agreement with the maximum film shrinkage exhibited by the GR710 material.

The carbon is completely removed from the GR720 spin-on glass material after 2.5 minutes of ashing. The GR720 resin is a denser material which reduces the diffusion rate of the oxygen radical through the film and subsequently makes the spin-on glass layer more resistant to oxygen ash. The decrease in shrinkage for the layers obtained from the GR710 and GR720 formulations after 1 minute of ash may be caused by a change in the material structure. Its decrease is not due to measurement error.

The carbon is not totally removed from either the spin-on glass layers derived from the GR653 or GR654 formulations, until after an ashing time of at least 5 minutes. The maximum film shrinkage is 35% which indicates the carbon content is lower than that of the GR710 and GR720 spin-on glass materials. All of the films exhibited cracks after each of the ashing experimental splits.

The GR653 boron-oxide doped, spin-on glass formulation provided layers with a higher ashing resistance than layers from the GR653 undoped, spin-on glass formulation. The boron-oxide is incorporated into the base polymer by a refluxing operation which also densities the base polymer. The carbon is not totally removed from those layers prepared from the GR653 boron-oxide doped, spin-on glass formulations until the ashing time exceeds 15 minutes. The maximum film shrinkage was again 35%, which indicates that the refluxing operation did not lower the carbon content of the film. The majority of the spin-on glass layers from the GR653 boron-oxide doped formulations did not crack after the ashing tests except for the 5 minute test.

The spin-on glass layers from the GR654 boron-oxide doped, spin-on glass formulation exhibited the highest ashing resistance of all spin-on glass layers tested. The film shrinkage after 15 minutes of ashing time was less than 20%, which indicates that a high percent of carbon still remains in the film.

The same procedure used to form the GR653 boron-oxide doped formulation was used to produce the GR654 boron-oxide doped formulation. There was a difference in the refluxing temperatures (80° C. for GR653 and 90° for GR654), and the carrier solvent was different for the GR653 and GR654 spin-on glass formulations (ethanol for GR653, N-butanol for GR654). In addition, after the refluxing procedure was completed, the film thickness for the GR653 boron-oxide doped, spin-on glass formulation was approximately 5,000Å, while the film thickness of the GR654 boron-oxide doped, spin-on glass formulation was over 1 micron. Not wishing to be bound by theory, it is believed the increase in film thickness for the GR654 spin-on glass formulation indicates that the condensation rate of the polymer was higher and that more boron-oxide may have been incorporated into the polymer.

The methyl based polyorganosiloxane polymers showed a 75 % improvement in the amount of film shrinkage over 15 minute ash in comparison to the methylphenyl-based polyorganosiloxane polymers. The GR654 boron-oxide doped, methyl-based, polysiloxane polymer showed a 150% improvement in film shrinkage after 15 minute ash. The incorporation of the boron-oxide into the methyl based polyorganosiloxane polymers also improved their cracking resistance of the polymer.

The preceding examples can be repeated with similar success by substituting the generically or specifically described reactants and/or operating conditions of this invention for those used in the preceding examples.

From the foregoing description, one skilled in the art can readily ascertain the essential characteristics of this invention, without departing from the spirit and scope thereof and can make various changes and modifications of the invention to adapt it to various usages and conditions.

What is claimed is:

1. A process for producing a boron-oxide doped, spin-on glass formulation for forming glassy layers which comprises:

dissolving a polyorganosiloxane polymer in an inert organic solvent having a boiling point of less than 250° C., adding a reactive boron-oxide compound to the solution of polyorganosiloxane polymer and heating said solution to dissolve the reactive boron-oxide compound therein, reacting the polyorganosiloxane polymer within the boron-oxide doped solution with a silane adhesion promoter under alkaline conditions, and reducing the pH of the reaction medium to a pH equal to or greater than 3.0 to arrest the reaction between the polyorganosiloxane and the silane adhesion promoter.

2. A process as in claim 1, wherein the reactive boron-oxide compound is incorporated into the polyorganosiloxane polymer.

3. A process as in claim 2 wherein the reactive boron-oxide compound is boric acid, an alkoxide or oxide of boric acid, trimethylborate or a mixture thereof.

4. The process of claim 1, wherein the silane adhesion promoter is an aminoorganotrialkoxysilane with $C_1$–$C_4$ alkoxy groups.

5. A process as in claim 1, wherein the pH is reduced to a value between 6 and 6.7 with an organic acid.

6. A process as in claim 1, wherein the polyorganosiloxane has a carbon content in the range of 15 to 50 wt. % with a weight average molecular weight of from 500–200,000.

7. A process as in claim 4, wherein the aminoorganotrialkoxysilane is selected from gamma-aminopropyltriethoxysilane, gamma-aminopropyltrimethoxysilane, N-beta-(amino-ethyl)-gamma-aminopropyltrimethoxysilane and N-beta-(amino-etyl)-N-beta-(aminoethyl)-gamma-aminopropyltrimethoxysilane.

8. A process as in claim 1, wherein the polyorganosiloxane is polymethylsiloxane or polymethylphenylsiloxane.

* * * * *